United States Patent
Elgort et al.

(10) Patent No.: US 7,643,864 B2
(45) Date of Patent: Jan. 5, 2010

(54) ADAPTIVE IMAGING PARAMETERS WITH MRI

(75) Inventors: Daniel Elgort, Cleveland, OH (US); Eddy Wong, Cleveland Heights, OH (US); Claudia Hillenbrand, Cleveland Heights, OH (US); Jonathan S. Lewin, Baltimore, MD (US); Jeffrey L. Duerk, Avon Lake, OH (US)

(73) Assignee: Case Western Reserve University, Cleveland, OH (US)

(*) Notice: Subject to any disclaimer, the term of this patent is extended or adjusted under 35 U.S.C. 154(b) by 747 days.

(21) Appl. No.: 11/050,341

(22) Filed: Feb. 3, 2005

(65) Prior Publication Data

US 2006/0173277 A1    Aug. 3, 2006

(51) Int. Cl.
 *A61B 5/00* (2006.01)
(52) U.S. Cl. ........................... 600/410; 324/307
(58) Field of Classification Search ......... 600/407–428; 424/9.3; 324/307, 314, 309, 318; 328/276
See application file for complete search history.

(56) References Cited

U.S. PATENT DOCUMENTS

| | | | | |
|---|---|---|---|---|
| 4,985,677 A | * | 1/1991 | Pauly | 324/309 |
| 5,532,595 A | * | 7/1996 | Lampman et al. | 324/309 |
| 5,869,463 A | * | 2/1999 | Major et al. | 514/44 |
| 6,275,721 B1 | * | 8/2001 | Darrow et al. | 600/410 |
| 6,687,527 B1 | * | 2/2004 | Wu et al. | 600/410 |
| 6,690,961 B1 | * | 2/2004 | Kaufman et al. | 600/410 |
| 6,968,225 B2 | * | 11/2005 | Vu | 600/410 |
| 7,078,899 B2 | * | 7/2006 | Dale et al. | 324/314 |
| 7,417,430 B2 | * | 8/2008 | Aldefeld et al. | 324/309 |
| 2004/0044279 A1 | * | 3/2004 | Lewin et al. | 600/407 |
| 2004/0051526 A1 | * | 3/2004 | Lee et al. | 324/307 |
| 2005/0033154 A1 | * | 2/2005 | deCharms | 600/410 |
| 2005/0065430 A1 | * | 3/2005 | Wiethoff et al. | 600/413 |
| 2005/0272997 A1 | * | 12/2005 | Grist et al. | 600/410 |
| 2006/0062486 A1 | * | 3/2006 | Lee et al. | 382/276 |
| 2006/0239920 A1 | * | 10/2006 | Kucharczyk et al. | 424/9.3 |

* cited by examiner

*Primary Examiner*—Eric F Winakur
*Assistant Examiner*—Lawrence N Laryea
(74) *Attorney, Agent, or Firm*—Kraguljac & Kalnay, LLC.

(57) ABSTRACT

Systems, methodologies, media, and other embodiments associated with automatically adapting MRI controlling parameters are described. One exemplary method embodiment includes configuring an MRI apparatus to acquire MR signal data using a non-rectilinear trajectory. The example method may also include acquiring MR signals, transforming the MR signals into image data, and selectively adapting the MRI controlling parameters based, at least in part, on information associated with the MR signals.

25 Claims, 5 Drawing Sheets

ADAPTIVE IMAGING PARAMETERS WITH MRI

FEDERAL FUNDING NOTICE

Portions of the claimed subject matter were developed with federal funding supplied under NIH Grants R01 CA81431 and R33 CA88144.

TECHNICAL FIELD

The systems, methods, computer-readable media and so on described herein relate generally to the magnetic resonance imaging (MRI) arts. They find particular application to automatically adapting imaging parameters based on feedback received during an MRI procedure. It is to be appreciated that in different examples that an MRI apparatus may acquire MR signals related to hydrogen nuclei, oxygen nuclei, sodium nuclei, phosphorous nuclei, and so on as known in the art.

BACKGROUND

Automatically adapting MRI image acquisition parameters based on feedback from a catheter inserted into a body is known in the art. For example, U.S. Published Application 20040044279, filed May 14, 2003 describes systems and methods for tracking a catheter position, orientation, speed, acceleration and so on and then automatically adjusting image acquisition parameters like field of view (FOV), resolution, and so on.

SUMMARY

While automatically adapting MRI image acquisition parameters based on feedback from a catheter has been described elsewhere, these descriptions have not related to non-catheter based feedback. Additionally, image acquisition techniques have been developed that facilitate improving temporal resolution and/or temporal efficiency during a tracking and/or survey phase to facilitate improving tracking and/or survey imaging and MRI controlling parameter adapting decision-making, even in catheter feedback based systems.

BRIEF DESCRIPTION OF THE DRAWINGS

The accompanying drawings, which are incorporated in and constitute a part of the specification, illustrate various example systems, methods, and so on, that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements, that multiple elements may be designed as one element, that an element shown as an internal component of another element may be implemented as an external component and vice versa, and so on. Furthermore, elements may not be drawn to scale.

DETAILED DESCRIPTION

Example systems and methods described herein concern automatically adjusting MRI imaging parameters based on feedback received during an MRI procedure. In one example, an MRI procedure may employ a non-rectilinear trajectory and/or non-Fourier pulse sequence that may be adapted in real-time based on feedback from the MRI procedure. Non-rectilinear trajectories facilitate improving properties like temporal resolution (e.g., the shortest time duration between two events that can be measured in an MRI procedure), and temporal efficiency (e.g., spatial resolution, signal to noise ratio, image quality per unit time) and thus may facilitate improving tracking imaging, survey imaging, triggering an adaptation, and so on. Additionally, non-rectilinear trajectories facilitate over-sampling the center of k-space and thus may be less sensitive to motion artifacts, which can also facilitate improving tracking and/or survey imaging. Furthermore, when using a non-rectilinear trajectory, FOV (field of view) values may be smaller than in conventional rectilinear systems because radial, spiral, and other similar non-rectilinear trajectories do not suffer from aliasing artifacts in the phase encoding direction as the FOV becomes smaller than the sample. While non-rectilinear trajectories are described, it is to be appreciated that in some examples, additional classes of pulse sequences known as non-Fourier imaging sequences may be employed. Example non-Fourier sequences may include, singular value decomposition (SVD) encoding, wavelet encoding, direct temporal encoding, and so on. These schemes may have an additional adaptive parameter, a number of encoding sets per image.

Non-rectilinear trajectories may be employed with catheter feedback or with non-catheter based feedback. Catheter feedback may include, for example, catheter position, location, orientation, speed, acceleration, and so on. Non-catheter feedback may include, for example, the presence or absence of a contrast agent, a change in the amount of oxygenated hemoglobin in a region, a change in the ability of water to diffuse in a tissue, and so on. Additional sources of non-catheter feedback may include metabolic sources, spectroscopic sources, physiologic sources, anatomic sources, and so on. Metabolic sources may concern, for example, the presence of certain metabolites as determined, for example, using spectroscopic techniques, targeted contrast agents, oxygen consumption data (e.g., as determined by BOLD scans) and so on. Spectroscopic sources may concern, for example, the presence of certain chemical species in the image volume. Physiologic sources may concern, for example, breath rate, heart rate, and so on. Anatomic sources may concern, for example, the presence of certain anatomy in the field of view.

Non-catheter based feedback may be acquired, for example, during perfusion based MRI procedures. A perfusion based MRI procedure may measure, for example, blood flow. By way of illustration, an MRI apparatus may substantially continuously acquire MR signals while a contrast agent is injected into the patient and perfuses through a tissue(s). Attributes like magnetic properties of the contrast agent may cause the MR signal from tissue taking up the contrast agent to be attenuated exponentially proportionally to the amount of contrast agent present in the tissue. Thus, before a change due to contrast agent uptake occurs, lower resolution survey imaging may be employed. However, based on feedback from the survey imaging like a change in contrast due to contrast agent uptake, higher resolution imaging may be initiated. The higher resolution imaging may be automatically terminated based on feedback like a decrease in the rate of change in the contrast. Automatically adapting imaging parameters in this manner may become more important in stronger systems (e.g., 3T) where limiting patient exposure to higher energy fields may be desired.

Non-catheter based feedback may also be acquired, for example, during diffusion based MRI procedures. Diffusion weighted MRI relates image intensities to the relative mobility of endogenous tissue water molecules. When cells die, they may trap water or change the area in which water can move according to Brownian motion. Therefore, dead tissue may appear different than live tissue in diffusion MRI. Thus, in one example, a diffusion based MRI procedure may measure, for example, diffusion characteristics of water in tissues being subjected to cell-manipulating procedures. For example, when delivering a therapeutic agent or when applying radiation it may be desirable to kill specific cells (e.g., tumor cells) that may be localized and thus imaged through diffusion MRI. When the agent is delivered the cells may begin to die. Before the agent is delivered, a lower resolution survey imaging may be employed. While the agent is working, which may be determined by changes in diffusion images, a higher resolution imaging may be employed to facilitate analyzing, for example, which cells are being killed, the rate at which cells are being killed, and so on. Once the rate of cell death changes in a desired way, the higher resolution imaging may be terminated. Once again, this automated imaging parameter control may become more important as real-time cell-specific therapeutic agent, radiation, and other cell manipulating procedures become more integrated with MR imaging.

Non-catheter based feedback may also be acquired, for example, during blood oxygen level dependent (BOLD) effect based MRI procedures. A BOLD MRI procedure may measure, for example, blood oxygen levels associated with increased oxygenated hemoglobin levels in a tissue. By way of illustration, increased activity in a tissue may cause a need for more oxygen in that tissue. The vascular system may respond to the need by increasing oxygenated hemoglobin in an area. The exact area that may receive the oxygenated hemoglobin may not be known beforehand. Thus, a wider FOV survey imaging may be employed until certain changes are detected. Then, high resolution, smaller FOV imaging may be employed in the areas in which changes are detected. The changes may happen too quickly and/or be too subtle to allow manual control of an MRI device to "zoom in" on the area(s) exhibiting the change. Thus, MRI imaging parameters may be automatically adapted to respond to the change.

While perfusion, diffusion, and BOLD examples are provided to illustrate non-catheter based feedback upon which MRI image acquisition parameters may be adapted, it is to be appreciated that other non-catheter based feedback may also facilitate automatically adapting imaging parameters. Example systems and methods facilitate automatically adapting parameters in real-time. For example, a feedback loop that includes monitoring intraprocedural data (e.g., catheter speed, saturation) and adapting parameters based on the monitoring may operate substantially constantly and substantially in real-time (e.g., multiple cycles per second).

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Common forms of a computer-readable medium include, but are not limited to, a floppy disk, a hard disk, a magnetic tape, a CD-ROM, other optical media, a RAM, a memory chip or card, a carrier wave/pulse, and other media from which a computer, a processor or other electronic device can read. Signals used to propagate instructions or other software over a network, like the Internet, can be considered a "computer-readable medium."

"Data store", as used herein, refers to a physical and/or logical entity that can store data. A data store may be, for example, a database, a table, a file, a list, a queue, a heap, a memory, a register, and so on. A data store may reside in one logical and/or physical entity and/or may be distributed between two or more logical and/or physical entities.

"Logic", as used herein, includes but is not limited to hardware, firmware, software and/or combinations of each to perform a function(s) or an action(s), and/or to cause a function or action from another logic, method, and/or system. A logic may take forms including a software controlled microprocessor, a discrete logic like an application specific integrated circuit (ASIC), a programmed logic device, a memory device containing instructions, and so on. A logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow operable control. For example, two entities can be operably connected by being able to communicate signals to each other directly or through one or more intermediate entities like a processor, operating system, a logic, software, or other entity. Logical and/or physical communication channels can be used to create an operable connection.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically and/or statically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated that the form of software may depend, for example, on requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein may be produced using programming languages and tools like Java, C++, assembly, firmware, microcode, and/or other languages and tools. Software, whether an entire system or a component of a system, may be embodied as an article of manufacture and maintained or provided as part of a computer-readable medium as defined previously. Another form of the software may include signals that transmit program code of the software to a recipient over a network or other communication medium. Thus, in one example, a computer-readable medium has a form of signals that represent the software/firmware as it is downloaded to a user. In another example, the computer-readable medium has a form of the software/firmware as it is maintained on the server.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

Figure 1:
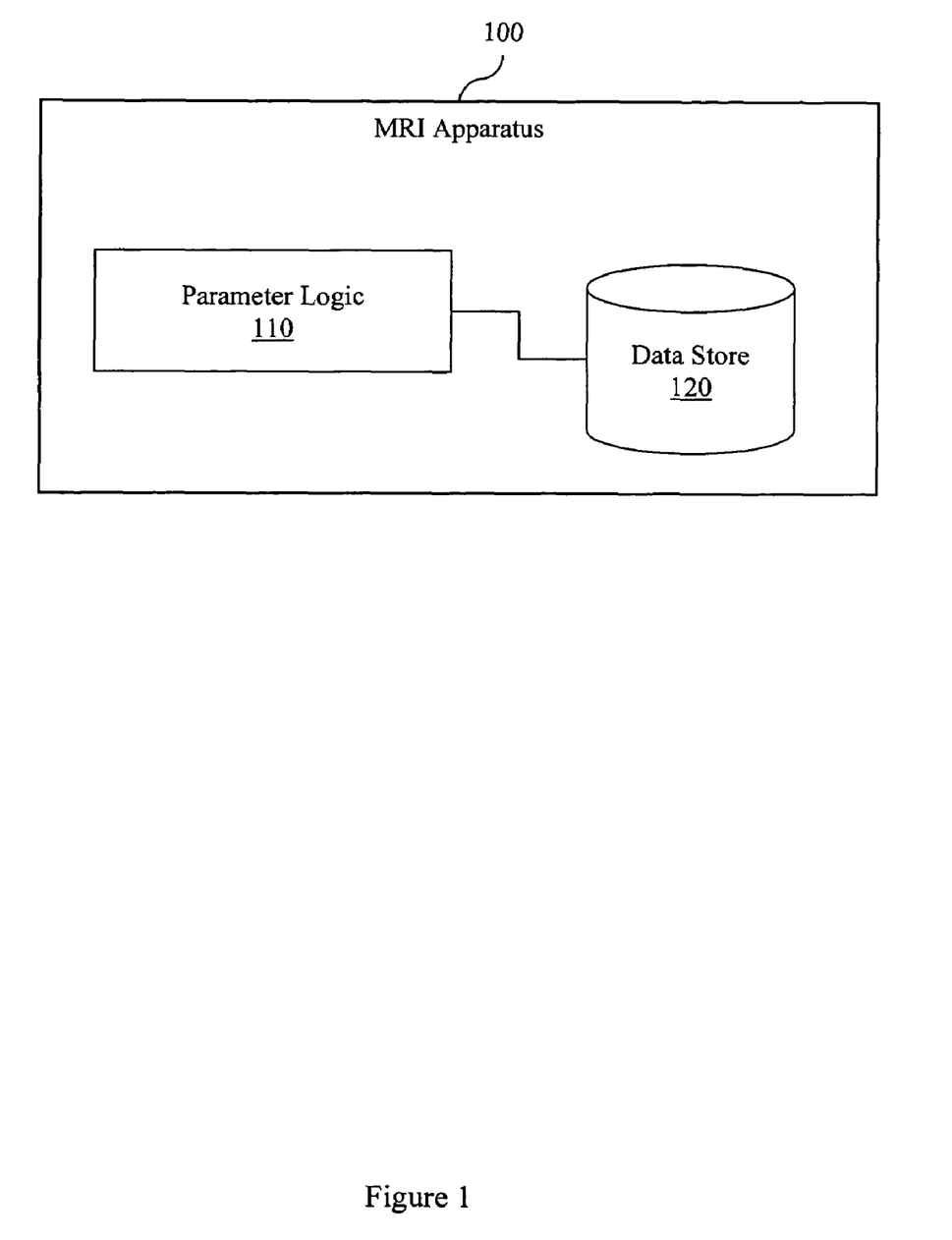
FIG. 1 illustrates an example MRI apparatus.

FIG. 1 illustrates an example MRI apparatus 100. Apparatus 100 may be one of many different types of MRI apparatus known in the art, for example a Siemens 1.5T Sonata imager. Apparatus 100 may be configured to acquire MR signals from an object (e.g., patient) during an MR procedure. In one example, apparatus 100 may be configured to use a non-rectilinear trajectory to acquire the MR signals. The non-rectilinear trajectories may employ imaging sequences like a radial sequence, a spiral sequence, a hybrid sequence (e.g., propeller) and so on. In different examples, the radial, spiral, and hybrid trajectories may be two dimensional or three dimensional. In one example, apparatus 100 may be controlled to adjust the number of radial projections collected for each image and thus control the temporal resolution in a way that is not possible with rectilinear trajectories since lines in a radial, spiral, or hybrid sequence may acquire information from the center of a data space to the edge of the data space, which is not the case with rectilinear trajectories.

Non-rectilinear trajectories facilitate increasing temporal resolution in MRI and also facilitate over-sampling the center of k-space, which in turn facilitates reducing motion artifacts. Thus, non-rectilinear trajectories provide improvements over conventional adaptive systems that employ rectilinear trajectories. Improvements are noted in survey and tracking image quality. For example, temporal efficiency (e.g., image quality per unit of time) may be improved. By way of illustration, as a bolus of contrast agent moves through a region, MR parameters like slice location, slice orientation, and so on may be automatically adjusted to facilitate tracking the contrast agent until it reaches a desired location. When the bolus arrives at a desired location, other MR parameters like spatial resolution, FOV, and so on may be automatically adjusted to acquire a desired image with desired parameters.

Apparatus 100 and thus the acquisition of MR signals by apparatus 100 may be controlled, at least in part, by imaging parameters that control, for example, the field of view (FOV), resolution and so on. Other imaging parameters may include, but are not limited to parameters that may control temporal resolution, spatial resolution, slice position, slice orientation, slice thickness, slice rotation, bandwidth, projections per MR signal data acquisition period, number of interleaves per MR signal data acquisition period, time from inversion (TI), signal to noise ratio, RF excitation/ADC center frequency, RF excitation/ADC phase, and so on. These parameters may take the form of values stored in computer memory locations. In different examples, the values may be communicated to apparatus 100 and/or may be stored in apparatus 100. Thus, the parameters may be automatically updated substantially in real time under programmatic control exercised in apparatus 100 and/or on a separate computer operably connected to apparatus 100.

How apparatus 100 operates to create conditions in an object so that the object will produce MR signals may also be controlled by imaging parameters like TE (time to echo), TR (time to repetition), tip angle for RF excitation, pulse sequence type, and so on. Thus, these parameters may also be dynamically adapted during MR procedures based, for example, on feedback in the MR signals.

Apparatus 100 may include a parameter logic 110 that is configured to facilitate selectively automatically adapting an imaging parameter(s) during the MR procedure. While parameter logic 110 is illustrated in apparatus 100, it is to be appreciated that parameter logic 110 may be external to but operably connected to apparatus 100. For example, parameter logic 110 may be implemented in software executing on a computer operably connected to apparatus 100.

Whether an imaging parameter is adapted may depend, for example, on analyzing object attribute(s). The analysis may be performed, for example, on k-space data and/or image data associated with MR signals received from the object being imaged by apparatus 100. By way of illustration, image data may indicate the presence, absence, and/or concentration of a contrast agent in a tissue. Thus, apparatus 100 may be controlled to change imaging parameters (e.g., parallel imaging on/off) based on whether the contrast agent is present. For example, there may be no point engaging in parallel imaging of a tissue region until the contrast agent is present in that tissue region. Similarly, image data may indicate that a certain region in the object being imaged exhibits a certain chemical signature. Once again, apparatus 100 may be controlled to change imaging parameters (e.g., pulse sequence) based on the chemical signature. For example, a first chemical signature may indicate that T1 weighted imaging is preferred while a second chemical signature may indicate that T2 weighted imaging is preferred. Thus, based on a chemical signature acquired during an MRI procedure, apparatus 100 may be switched from a pulse sequence that favors T1 weighting to T2 weighting.

Apparatus 100 may also include a data store 120 configured to store, among other things, imaging parameters. While data store 120 is illustrated in apparatus 100, it is to be appreciated that data store 120 may be in other locations like in an external disk drive operably connected to apparatus 100. Additionally, data store 120 may be distributed between various components of apparatus 100. For example, parameters related to how many members of a phased array of receivers employed in parallel imaging may be stored locally to a phased array control circuit (not illustrated). Similarly, parameters related to a pulse sequence type may be stored locally to a pulse sequence controller (not illustrated).

Apparatus 100 may be configured to perform different types of MR procedures. For example, the MR procedure may be a perfusion MRI procedure, a diffusion MRI procedure, a blood oxygen level dependent (BOLD) MRI procedure, a catheter based procedure, and so on. For these types of procedures, apparatus 100 may be reconfigurable substantially in real time based on data retrieved from MR signals acquired during the procedure. For example, during a perfusion MRI procedure, data retrieved from MR signals may indicate that a sufficient amount of tissue has achieved a desired contrast after the introduction of a contrast agent and thus the MRI apparatus 100 may be controlled to begin high resolution imaging. High resolution imaging may not be desired while waiting for the desired contrast to occur due to, for example, exposure limits, power requirements, interactions between RF (radio frequency) power and the contrast agent, and so on.

Similarly, during a diffusion MRI procedure, data derived from the MR signals may indicate that a certain amount of cell death has occurred or been observed and thus MRI apparatus 100 may be controlled to stop imaging or to switch to a different type of imaging. For example, diffusion imaging may be employed until a certain amount of tissue exhibits cell death, then a different type of image may be desired. During a BOLD MRI procedure, a region of interest may be identified from data derived from the MR signals and apparatus 100 may be controlled to switch from a wider survey imaging FOV to a more focused detailed imaging FOV once the region has been identified. Thus, when an effect may occur in a region but the exact location in the region is not known, a wider FOV may be employed. Then, when the exact location of the effect is determined, a smaller FOV may be used to acquire images from the exact location.

Parameter logic 110 may be configured to analyze and respond to MR signals, k-space data, and/or image data associated with a perfusion MRI procedure with respect to properties like contrast change, contrast rate of change, contrast saturation, and so on. In one example, determining whether a desired contrast change has been achieved, or whether contrast is changing at a desired rate can be a trigger to change imaging from a lower resolution tracking mode to a higher resolution detailed examination mode. In another example, saturation concerning suppressing signals from fat, water, or blood flowing in a region may be examined. In another example, determining whether a contrast agent provides an adequate saturation for imaging by examining a contrast saturation may facilitate adjusting timing parameters used to tune certain types of suppression scans (e.g., Inversion Recovery scans). For example, parameters like flip angle, bandwidth of the RF excitation pulse, TIC (time between inversion and imaging excitation pulse), phase values, phase cycling strategies, and so on may be adapted. Thus, imaging parameters including both acquisition related parameters and effect-generating parameters may be adapted.

Parameter logic 110 may also be configured to analyze and respond to MR signals, k-space data, and/or image data associated with a diffusion MRI procedure with respect to properties like a change in water diffusion, a rate of change of water diffusion, and so on. In one example, determining whether a change in water diffusion has occurred may be employed as a trigger to indicate that cell death has begun and imaging parameters and/or therapeutic protocol should be adapted.

Parameter logic 110 may also be configured to analyze and respond to MR signals, k-space data, and/or image data associated with a BOLD MRI procedure with respect to properties like a change in blood oxygen in an imaged region, a rate of change of blood oxygen in an imaged region, and so on. For example, some motor tests may cause a muscle to be active and thus require more oxygen. Similarly, some neurological tests may cause an area of the brain to become more active and similarly require more oxygen. However, the exact location of where the oxygen will be required, and/or the amount of oxygenated hemoglobin required to deliver the oxygen may be unknown. Thus, high speed, wide FOV, lower resolution survey imaging may be employed to identify a region, and then, when the region is identified, imaging parameters may be adapted to provide higher spatial resolution images with a more focused FOV.

Parameter logic 110 may also be configured to analyze and respond to MR signals, k-space data, and/or image data associated with a catheter based MRI procedure with respect to properties like a catheter location, a catheter speed, a catheter acceleration, a catheter orientation, and so on. For example, as a catheter is moved around inside a patient, tracking and/or imaging data may be acquired and imaging parameters may be automatically adjusted substantially in real time based on information in the tracking and/or imaging data. By way of illustration, as a catheter slows down, lower temporal resolution, higher spatial resolution, larger FOV imaging may be possible. But as a catheter speeds up, higher temporal resolution, lower spatial resolution, smaller FOV imaging may be required. As described above, non-rectilinear (e.g., radial, spiral) acquisition trajectories facilitate improving temporal resolution and reducing motion artifacts and thus may provide improvements over conventional adaptive imaging systems, particularly with respect to images acquired while the catheter is moving.

In one example apparatus 100 may be configured to perform parallel imaging and thus may include a phased array of receivers (not illustrated). The imaging parameters manipulated by parameter logic 110 and stored by data store 120 may therefore also include a count of radio frequency channels to employ in parallel imaging, a count of receivers to employ in parallel imaging, and the like. These parameters may be manipulated to dynamically reconfigure apparatus 100 to use more or less receivers and/or RF channels and to implement higher or lower degrees of parallelism. This facilitates reducing the time for obtaining an MR image up to a factor related to the number of independent coil channels in the phased array. Thus, parallel imaging may be selectively employed to balance temporal resolution against signal to noise resolution.

When imaging parameters may be adjusted may be controlled by various adaptation threshold functions. Similarly, how imaging parameters may be adjusted may also be controlled by various adaptation amount functions. By way of illustration, at a first time apparatus 100 may employ a continuous adaptation function that substantially constantly adjusts image parameters within a defined but substantially constant range (e.g., FOV from 16×16 pixels to 1024×1024 pixels). But at a second time, apparatus 100 may employ a discrete adaptation function that only adjusts image parameters between two values (e.g., high resolution, low resolution) on the occurrence of a pre-determined event.

While perfusion, diffusion, BOLD, and catheter based procedures have been described, it is to be appreciated that apparatus 100 may be configured to automatically adapt imaging parameters based on other inputs. Once again, non-rectilinear trajectories with improved temporal resolution and/or temporal efficiency facilitate acquiring and responding, in real time, to information acquired from an object being imaged. For example, it may be desired to acquire images only during certain phases of a cardiac cycle (e.g., when heart is at rest). Thus, a first, lower resolution cardiac cycle tracking may occur during the systolic cycle, but a second, higher resolution diagnostic imaging may occur during the diastolic cycle. Similar control may be exercised during other cycles like the respiratory cycle.

Figure 2:
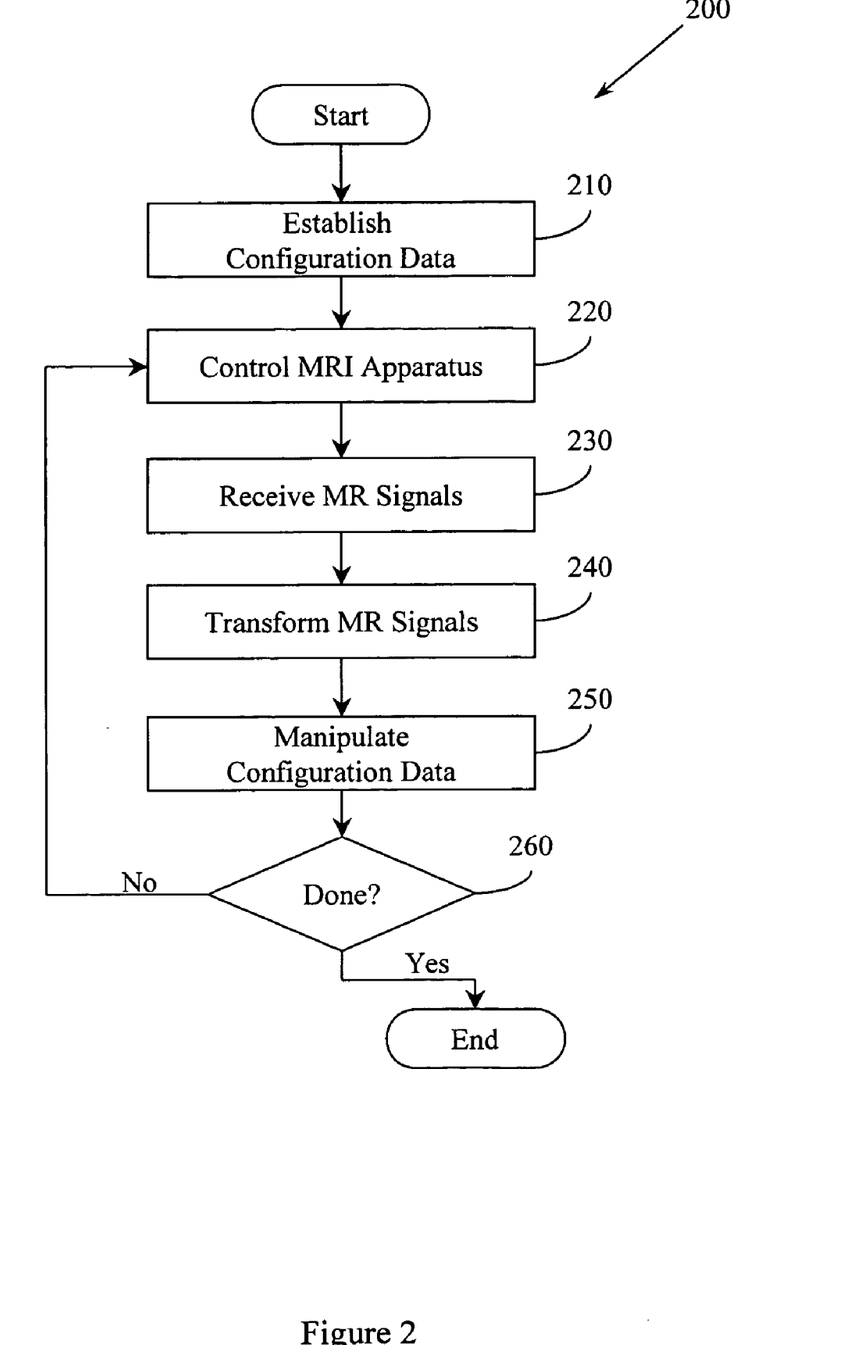
FIG. 2 illustrates an example computer-executable method associated with automatically adapting MRI imaging parameters based on feedback from an MRI procedure.
Figure 3:
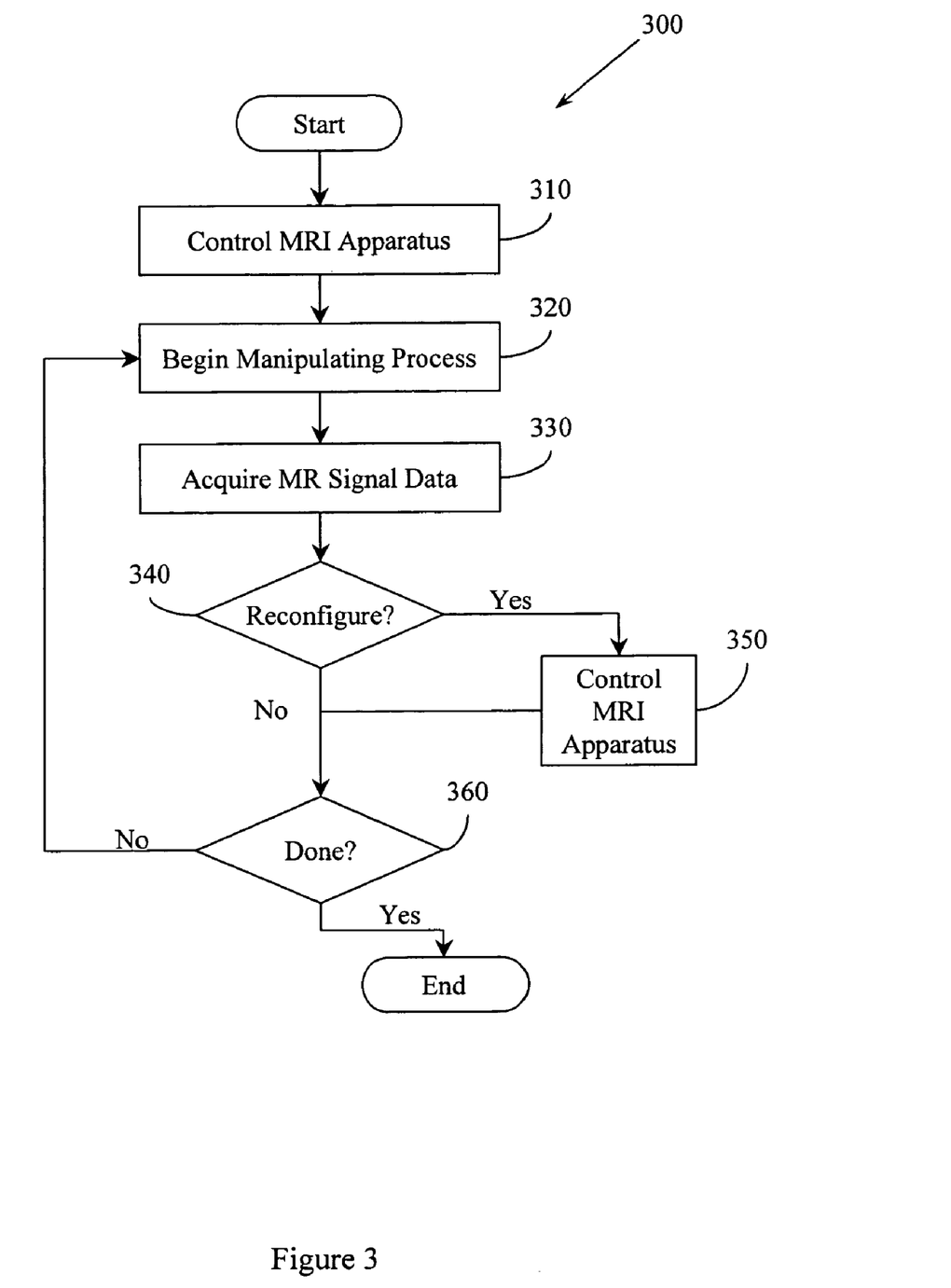
FIG. 3 illustrates an example computer-executable method associated with automatically adapting MRI imaging parameters based on feedback from an MRI procedure.

Example methods may be better appreciated with reference to the flow diagrams of FIGS. 2 and 3. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks.

In the flow diagrams, blocks denote "processing blocks" that may be implemented with logic. The processing blocks may represent a method step and/or an apparatus element for performing the method step. A flow diagram does not depict syntax for any particular programming language, methodology, or style (e.g., procedural, object-oriented). Rather, a flow diagram illustrates functional information one skilled in the art may employ to develop logic to perform the illustrated processing. It will be appreciated that in some examples, program elements like temporary variables, routine loops, and so on, are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 2 illustrates an example computer-executable method 200 associated with automatically adapting MRI imaging parameters based on feedback from an MRI procedure. Method 200 may include, at 210, establishing a set of configuration data. The configuration data may be used to control how an MRI apparatus generates magnetic fields, RF pulses and so on. Similarly, the configuration data may be used to control the MRI apparatus to acquire MR signals from an object using a non-rectilinear trajectory. For example, the configuration data may hold values that can be communicated to control registers in various MRI apparatus components. Additionally, and/or alternatively, the configuration data may hold values that can program the MRI apparatus to act in certain ways. By way of illustration, the configuration data may store a value that controls how many lines are used in a radial trajectory. The non-rectilinear trajectories may employ imaging sequences like two dimensional (2d) or three dimensional (3d) radial sequences, 2d or 3d spiral sequences, 2d or 3d hybrid sequences (e.g., propeller), other non-rectilinear k-space trajectories, and so on.

Method 200 may also include, at 220, controlling the MRI apparatus to acquire MR signals from the object. How the MR signals are acquired will depend, at least in part, on the configuration data established at 210. Similarly, how the MRI apparatus interacts with an object being imaged (e.g., pulse sequence) may be controlled by the configuration data established at 210.

Method 200 may also include, at 230, receiving MR signals from the object and, at 240, transforming the received MR signals into an image data. Receiving and transforming MR signals into image data is well known in the art and thus not described herein for the sake of brevity. How the MR signals are received (e.g., acquisition trajectory) may be controlled, at least in part, by the configuration data established at 210.

Method 200 may include, at 250, selectively manipulating the set of configuration data established at 210. Whether the data is manipulated may depend, at least in part, on feedback information provided in the MR signals. Feedback data may include, for example, contrast information, diffusion information, blood oxygen information, catheter information, spectroscopic information, contrast agent information, anatomical information, and so on. Method 200 may continue to receive MR signals from the object and thus may cycle over establishing and/or manipulating configuration data, controlling the MRI apparatus, receiving signals, and transforming signals. Thus, at 260, a determination may be made concerning whether to continue the MRI procedure. If the determination is Yes, then processing may return to 220, otherwise processing may conclude.

In one example, method 200 may be executed in association with an MRI apparatus that is configured to perform a perfusion MRI. Thus, the feedback information may include data like contrast changes, contrast rates of change, contrast saturation, and so on. In another example, method 200 may be executed in association with an MRI apparatus configured to perform a diffusion MRI. Thus, the feedback information may include data like water diffusion changes, water diffusion rates of change, and so on. In another example, method 200 may be executed in association with an MRI apparatus that is configured to perform a blood oxygen level dependent (BOLD) MRI and thus the feedback information may include data like blood oxygen changes, blood oxygen rates of change, and so on.

In yet another example, method 200 may be executed in association with an MRI apparatus that is configured to acquire the MR signals during a surgical procedure. The surgical procedure will likely be a minimally invasive procedure like a catheter based procedure, a micro-machine based procedure, and the like. In this example, the feedback information may therefore include information like device position, device speed, device acceleration, a device orientation, and so on.

As described above the configuration data may facilitate controlling the operation of an MRI apparatus in real time. Therefore, the configuration data may include, but is not limited to, a temporal resolution control value, a spatial resolution control value, a field of view control value, a trajectory line count control data, a slice position control value, a slice orientation control value, a slice thickness control value, a slice rotation control value, a bandwidth control value, a time to repetition (TR) control value, a time to echo (TE) control value, a time from inversion (TI) control value, an RF excitation tip angle control value, an RF excitation/ADC center frequency control value, an RF excitation/ADC phase control value, a pulse sequence type control value, an active receive coils for data collection control value (including catheter based invasive coils and external coils placed on the patient or embedded in the MR hardware), and a number of projections per signal data acquisition period of time control value. By way of illustration, the temporal resolution control value may be placed in a register that controls the time between MR signal acquisitions. Thus, it is to be appreciated that the configuration data may be kept separately as a set of values that are then transmitted to a device and/or may be kept directly in a controlling device.

As described in connection with FIG. 1, an MRI apparatus may include a set of phased array receivers and may be configured to control a set of RF channels to facilitate parallel imaging. Thus, in one example, the set of configuration data that can be established and manipulated by method 200 may include data for configuring a phased array of receivers associated with the MRI apparatus. The additional data may facilitate controlling, at least in part, parallel imaging performed by the MRI apparatus.

While FIG. 2 illustrates various actions occurring in serial, it is to be appreciated that various actions illustrated in FIG. 2 could occur substantially in parallel. By way of illustration, a first process could control an MRI apparatus, while a second process could receive MR signals from an object being imaged by the MRI apparatus. As mentioned above, the MR signals could be associated with, for example, hydrogen nuclei, oxygen nuclei, sodium nuclei, and so on. Similarly, a third process could transform the MR signals into image data while a fourth process substantially constantly manipulates configuration data that facilitates controlling the MRI apparatus. While four processes are described, it is to be appreciated that a greater and/or lesser number of processes could be employed and that lightweight processes, regular processes, threads, and other approaches could be employed. It is to be appreciated that other example methods may, in some cases, also include actions that occur substantially in parallel.

In one example, methodologies are implemented as processor executable instructions and/or operations provided on a computer-readable medium. Thus, in one example, a computer-readable medium may store processor executable instructions operable to perform a method that includes establishing a set of configuration data to control an MRI apparatus to acquire MR signals from an object using a non-rectilinear trajectory and/or non-Fourier pulse sequence. The method may also include controlling the MRI apparatus to acquire MR signals from the object, receiving MR signals from the object, transforming received MR signals into an image data, and while continuing to receive MR signals from the object, selectively manipulating the set of configuration data based on feedback provided in the MR signals. While this method is described being provided on a computer-readable medium, it is to be appreciated that other example methods described herein may also be provided on a computer-readable medium.

FIG. 3 illustrates an example computer-executable method 300 associated with automatically adapting MRI imaging parameters in real time based on feedback from an MRI procedure. Method 300 may be used, for example, in connection with a cell-manipulating clinical protocol (e.g., chemotherapy). Thus, method 300 may include, at 310, controlling an MRI apparatus to take on a first state based on a first set of configuration data. The MRI apparatus may take on the state based on the configuration data because the configuration data may be used to write to control registers, to control locations, to provide values for various components of the MRI apparatus, and so on.

With the MRI apparatus configured, method 300 may proceed, at 320, to control an apparatus to begin the cell manipulating action in a selected tissue region. For example, after acquiring an initial MRI image, a therapeutic agent delivery may be initiated in the imaged area. The therapeutic agent may be, for example, a drug or toxin that may be delivered in manners including, but not limited to, systemically, through a catheter, through a needle, from a micro-machine, and so on.

Method 300 may also include, at 330, acquiring MR signal data from the selected tissue region. How the signal is acquired may depend, at least in part, on how the MRI apparatus was controlled at 310. Feedback information that can be derived from the MR signal data facilitates determining whether to reconfigure the MRI apparatus, whether to terminate the cell manipulating action, and so on. Thus, method 300 may include, at 340, making a determination concerning whether to reconfigure the MRI apparatus. If the determination at 340 is No, then processing may proceed at 360. If the determination at 340 is Yes, then method 300 may proceed, at 350, to selectively control the MRI apparatus to take on a second state based on a second set of configuration data. For example, the first state of 310 may have included controlling the MRI apparatus to acquire images with a first temporal resolution, having a first spatial resolution and first FOV, while the second state of 350 may include controlling the MRI apparatus to acquire images with a second temporal resolution, having a second spatial resolution and second FOV.

At 360, a determination may be made concerning whether to terminate the cell manipulating action based on information provided in the MR signal data. For example, if cell death has been noticed through differences acquired in diffusion MRI images, then the cell manipulating action may be terminated. While cell death is described, and while therapeutic agents are illustrated, it is to be appreciated that method 300 may facilitate adapting MRI imaging parameters and/or controlling other surgical, clinical, and/or procedures. By way of illustration, MRI adaptive parameter controllable procedures may include delivering a therapeutic agent, delivery radiation, heating a region, freezing a region, depriving oxygen from a region, and so on.

Figure 4:
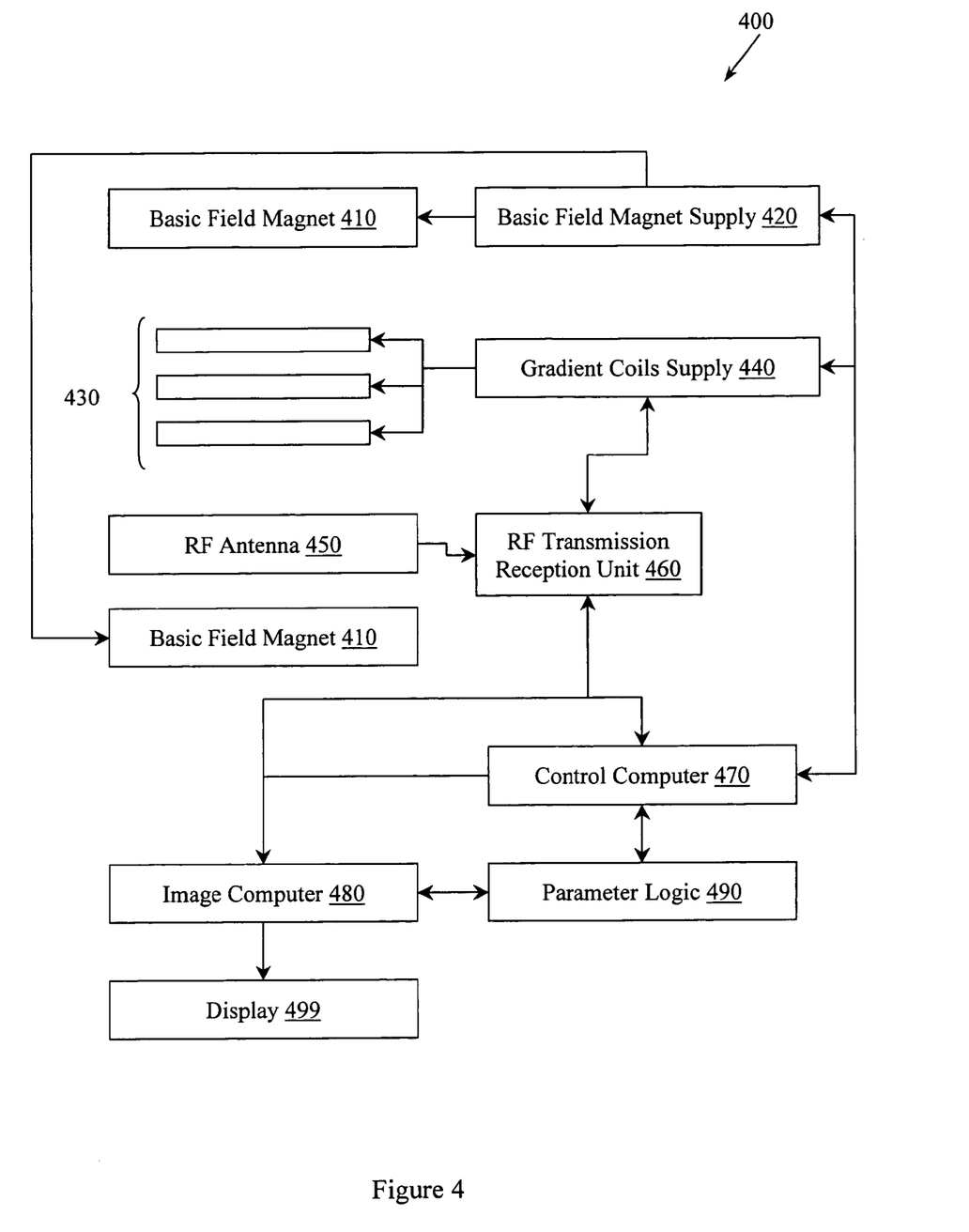
FIG. 4 illustrates an example MRI apparatus configured to automatically adapt MRI imaging parameters.

FIG. 4 illustrates an example MRI apparatus 400 configured to automatically adapt MRI imaging parameters. The apparatus 400 includes a basic field magnet(s) 410 and a basic field magnet supply 420. Ideally, the basic field magnets 410 would produce a uniform $B_0$ field. However, in practice, the $B_0$ field may not be uniform, and may vary over an object being imaged by the MRI apparatus 400. MRI apparatus 400 may include gradient coils 430 configured to emit gradient magnetic fields like $G_S$, $G_P$ and $G_R$. The gradient coils 430 may be controlled, at least in part, by a gradient coils supply 440. In some examples, the timing, strength, and orientation of the gradient magnetic fields may be controlled, and thus selectively adapted during an MRI procedure. Therefore, parameters associated with these types of fields may be dynamically adapted in response to feedback in acquired MR signals.

MRI apparatus 400 may also include an RF antenna 450 that is configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. In one example, separate RF transmission and reception coils can be employed. The RF antenna 450 may be controlled, at least in part, by an RF transmission-reception unit 460. The gradient coils supply 440 and the RF transmission-reception unit 460 may be controlled, at least in part, by a control computer 470. In one example, the control computer 470 may be programmed to perform methods like those described herein.

The magnetic resonance signals received from the RF antenna 450 can be employed to generate an image, and thus may be subject to a transformation process like a two dimensional FFT that generates pixilated image data. The transformation can be performed by an image computer 480 or other similar processing device. In one example, image computer 480 may be programmed to perform methods like those described herein. The image data may then be shown on a display 499.

While FIG. 4 illustrates an example MRI apparatus 400 that includes various components connected in various ways, it is to be appreciated that other MRI apparatus may include other components connected in other ways. In one example, to implement the example systems and methods described herein, MRI apparatus 400 may be configured with a parameter logic 490. In different examples, parameter logic 490 may be permanently and/or removably attached to an MRI apparatus. While parameter logic 490 is illustrated as a single logic connected to control computer 470 and image computer 480, it is to be appreciated that parameter logic 490 may be distributed between and/or operably connected to other elements of apparatus 400.

Figure 5:
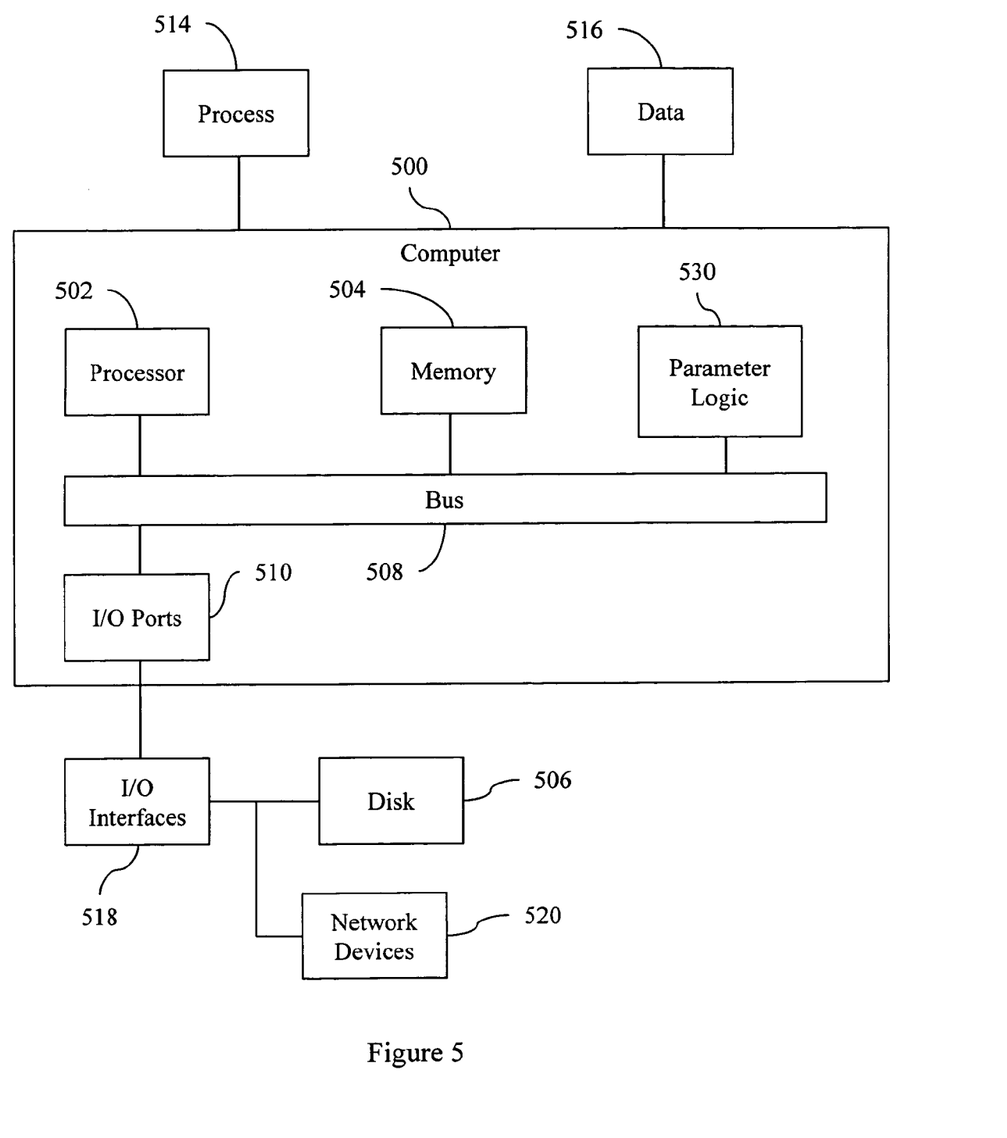
FIG. 5 illustrates an example computer in which example systems and methods illustrated herein can operate, the computer being operably connectable to an MRI apparatus.

FIG. 5 illustrates an example computer 500 in which example methods illustrated herein can operate and in which example adapting logics may be implemented. In different examples computer 500 may be part of an MRI apparatus or may be operably connectable to an MRI apparatus.

Computer 500 includes a processor 502, a memory 504, and input/output ports 510 operably connected by a bus 508. In one example, computer 500 may include a parameter logic 530 that is configured to facilitate dynamically reconfiguring the operation of an MRI apparatus. Thus, parameter logic 530, whether implemented in computer 500 as hardware, firmware, software, and/or a combination thereof may provide means for configuring an MRI apparatus to perform an MRI procedure and to acquire MR signals using a non-rectilinear trajectory during the MRI procedure, means for transforming MR signals into image data, means for establishing a threshold condition that controls whether the MRI apparatus should be reconfigured during the procedure, means for examining the image data to determine whether the threshold condition has been met, and means for reconfiguring the MRI apparatus in response to determining that the threshold condition has been met. In different examples, parameter logic 530 may be permanently and/or removably attached to computer 500.

Processor 502 can be a variety of various processors including dual microprocessor and other multi-processor architectures. Memory 504 can include volatile memory and/or non-volatile memory. A disk 506 may be operably connected to computer 500 via, for example, an input/output interface (e.g., card, device) 518 and an input/output port 510. Disk 506 can include, but is not limited to, devices like a magnetic disk drive, a tape drive, a Zip drive, a flash memory card, and/or a memory stick. Furthermore, disk 506 may include optical drives like a CD-ROM and/or a digital video ROM drive (DVD ROM). Memory 504 can store processes 514 and/or data 516, for example. Disk 506 and/or memory 504 can store an operating system that controls and allocates resources of computer 500.

Bus 508 can be a single internal bus interconnect architecture and/or other bus or mesh architectures. While a single bus is illustrated, it is to be appreciated that computer 500 may communicate with various devices, logics, and peripherals using other busses that are not illustrated (e.g., PCIE, SATA, Infiniband, 1394, USB, Ethernet).

Computer 500 may interact with input/output devices via i/o interfaces 518 and input/output ports 510. Input/output devices can include, but are not limited to, a keyboard, a microphone, a pointing and selection device, cameras, video cards, displays, disk 506, network devices 520, and the like. Input/output ports 510 can include but are not limited to, serial ports, parallel ports, and USB ports.

Computer 500 may operate in a network environment and thus may be connected to network devices 520 via i/o interfaces 518, and/or i/o ports 510. Through the network devices 520, computer 500 may interact with a network. In one example, computer 500 may be connected through a network to the MI apparatus whose acquisition parameters may be dynamically adapted. Through the network, computer 500 may be logically connected to remote computers. The networks with which computer 500 may interact include, but are not limited to, a local area network (LAN), a wide area network (WAN), and other networks.

While example systems, methods, and so on, have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on, described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
    a magnetic resonance imaging (MRI) apparatus configured to acquire a magnetic resonance (MR) signal from an object during an MR procedure using a radial trajectory without acquiring information associated with a catheter inserted into the object, the apparatus being controlled, at least in part, by an imaging parameter;
    a parameter logic configured to selectively automatically adapt, substantially in real time, the imaging parameter during the MR procedure based, at least in part, on analyzing one or more attributes of the object as provided in data associated with the MR signal without analyzing an attribute of a catheter; and
    a data store configured to store the imaging parameter.

2. The system of claim 1, the imaging parameter being a number of radial projections per MR signal acquisition period of time.

3. The system of claim 2, where the MR procedure is a perfusion MRI procedure, and where the parameter logic is configured to analyze and respond to the data associated with MR signals from the perfusion MRI procedure with respect to one or more of, a contrast change data, a contrast rate of change data, and a contrast saturation data.

4. The system of claim 2, where the MR procedure is a diffusion MRI procedure, and where the parameter logic is configured to analyze and respond to the data associated with MR signals from the diffusion MRI procedure with respect to one or more of, a water diffusion change data, and a water diffusion rate of change data.

5. The system of claim 2, where the MR procedure is a BOLD MRI procedure, and where the parameter logic is configured to analyze and respond to the data associated with MR signals from the BOLD MRI procedure with respect to one or more of, a blood oxygen change data, and a blood oxygen rate of change data.

6. The system of claim 2, where the MR procedure is a perfusion MRI procedure, and where the parameter logic is configured to analyze and respond to the data associated with MR signals from the catheter based MRI procedure with respect to one or more of, a catheter location, a catheter speed, a catheter acceleration, and a catheter orientation.

7. The system of claim 2, where the MRI apparatus is controllable to have a field of view (FOV) smaller than a sample.

8. The system of claim 2, the imaging parameters including one or more of, a temporal resolution parameter, a spatial resolution parameter, a field of view (FOV) parameter, a slice position parameter, a slice orientation parameter, a slice thickness parameter, a slice rotation parameter, a bandwidth parameter, a time to repetition (TR) parameter, a time to echo (TE) parameter, time from inversion (TI) parameter, a signal to noise ratio parameter, a tip angle for the RF excitation parameter, an RF excitation/ADC center frequency parameter, an RF excitation/ADC phase parameter, an active receive coils for data collection parameter, a pulse sequence type parameter, a number of projections per MR signal acquisition period of time parameter, and a number of interleaves per MR signal data acquisition period of time parameter.

9. The system of claim 2, the MRI apparatus being configured with a phased array of receivers configured to facilitate parallel imaging.

10. The system of claim 9, the imaging parameters including one or more of, a count of radio frequency channels to employ in parallel imaging, and a count of receivers to employ in parallel imaging.

11. The system of claim 2, the imaging parameters being adapted in response to one or more of, a contrast agent presence, and a chemical signature.

12. The system of claim 2, the imaging parameters being adapted according to one of, a continuous function, and a discrete function.

13. The system of claim 2, the imaging parameters being adapted based, at least in part, on a cardiac cycle phase, and a respiration cycle phase.

14. The system of claim 1, where the radial trajectory is one of a two-dimensional radial imaging sequence, a two-dimensional spiral imaging sequence, a two-dimensional hybrid imaging sequence, a two-dimensional non-rectilinear k-space trajectory, a three-dimensional radial imaging sequence, a three-dimensional spiral imaging sequence, a three-dimensional hybrid imaging sequence, and a three-dimensional non-rectilinear k-space trajectory.

15. A system, comprising:
a magnetic resonance imaging (MRI) apparatus configured to acquire an MR signal from an object using a radial imaging sequence during one of, a perfusion MRI procedure, a diffusion MRI procedure, a blood oxygen level dependent (BOLD) MRI procedure, a functional imaging procedure, a metabolic imaging procedure, and an anatomical imaging procedure using a contrast mechanism, the apparatus being controlled, at least in part, by one or more imaging parameters
a parameter logic configured to selectively automatically adapt a number of radial projections per MR signal acquisition period of time during the MR procedure based, at least in part, on analyzing one or more attributes of the object as provided in data associated with the MR signal without acquiring or analyzing any information associated with a catheter; and
a data store configured to store the imaging parameters;
the imaging parameters including one or more of, a temporal resolution parameter, a spatial resolution parameter, a field of view (FOV) parameter, a slice position parameter, a slice orientation parameter, a slice thickness parameter, a slice rotation parameter, a bandwidth parameter, a time to repetition (TR) parameter, a time to echo (TE) parameter, a tip angle for the RF excitation parameter, a pulse sequence type parameter, a number of projections per signal data acquisition period of time parameter, a number of interleaves per MR signal acquisition period of time parameter, a time from inversion (TI) parameter, a signal to noise ratio parameter, an RF excitation/ADG center frequency parameter, an RE excitation/ADC phase parameter, and an active receive coils for data collection parameter,
the imaging parameters being adapted according to one of, a continuous function, and a binary function.

16. A computer-implemented method, comprising:
establishing a set of configuration data to control an MRI apparatus to acquire MR signals from an object using one or more of a non-rectilinear trajectory, and a non-Fourier imaging sequence;
controlling the MRI apparatus to acquire MR signals from the object;
receiving MR signals from the object, where the signals are associated with the object and are not associated with a device inserted into the object;
transforming received MR signals into an image data; and
while continuing to receive MR signals from the object, selectively manipulating the set of configuration data in real time to control the MRI apparatus to acquire MR signals based, at least in part, on a feedback information provided in the MR signals.

17. The method of claim 16, the MRI apparatus being configured to perform a perfusion MRI and the feedback information including one or more of, a contrast change data, a contrast rate of change data, and a contrast saturation data.

18. The method of claim 16, the MRI apparatus being configured to perform a diffusion MRI and the feedback information including one or more of, a water diffusion change data, and a water diffusion rate of change data.

19. The method of claim 16, the MRI apparatus being configured to perform a blood oxygen level dependent (BOLD) MRI and the feedback information including one or more of, a blood oxygen change data, and a blood oxygen rate of change data.

20. The method of claim 16, the MRI apparatus being configured to acquire the MR signals during a surgical procedure.

21. The method of claim 16, the set of configuration data including one or more of, a temporal resolution control value, a spatial resolution control value, a field of view (FOV) control value, a trajectory line count control data, a slice position control value, a slice orientation control value, a slice thickness control value, a slice rotation control value, a bandwidth control value, a time to repetition (TR) control value, a time to echo (TE) control value, a tip angle for the RF excitation control value, a pulse sequence type control value, a number of projections per signal data acquisition period of time control value, a number of interleaves per MR signal data acquisition period of time parameter, a time from inversion (TI) parameter, a signal to noise ratio parameter, an RE excitation/ADC center frequency parameter, an RE excitation/ADC phase parameter, and an active receive coils for data collection parameter.

22. The method of claim 21, employing one of, a radial imaging sequence, a spiral imaging sequence, and a hybrid imaging sequence.

23. The method of claim 22, the set of configuration data including data for configuring a phased array of receivers associated with the MRI apparatus to control, at least in part, parallel imaging performed by the MRI apparatus.

24. A computer-readable medium storing computer-executable instructions operable to perform a method, the method comprising:
establishing a set of configuration data to control an MRI apparatus to acquire MR signals from an object using one or more of a non-rectilinear trajectory, and a non-Fourier imaging sequence;
controlling the MRI apparatus to acquire MR signals from the object;
receiving MR signals from the object, where the signals are associated with the object and are not associated with a device inserted into the object;
transforming received MR signals into an image data; and
while continuing to receive MR signals from the object, selectively manipulating the set of configuration data substantially in real time based, at least in part, on a feedback information provided in the MR signals.

25. An apparatus, comprising:
means for configuring an MRI apparatus to perform an MRI procedure and to acquire MR signals using one or more of a non-rectilinear trajectory, and a non-Fourier imaging sequence during the MRI procedure;
means for transforming MR signals into image data;
means for establishing a threshold condition that controls whether the MRI apparatus should be reconfigured during the procedure, the threshold condition concerning one or more of, a perfusion data change, a perfusion data rate of change, a diffusion data change, a diffusion data rate of change, a blood oxygen level data change, a blood oxygen level data rate of change, a spectroscopic data, a contrast agent data, and an anatomical data;
means for examining the image data to determine whether the threshold condition has been met; and
means for reconfiguring the MRI apparatus in response to determining that the threshold condition has been met.

* * * * *

UNITED STATES PATENT AND TRADEMARK OFFICE
CERTIFICATE OF CORRECTION

| | | |
|---|---|---|
| PATENT NO. | : 7,643,864 B2 | Page 1 of 1 |
| APPLICATION NO. | : 11/050341 | |
| DATED | : January 5, 2010 | |
| INVENTOR(S) | : Elgort et al. | |

It is certified that error appears in the above-identified patent and that said Letters Patent is hereby corrected as shown below:

Specification:

In column 14, line 13, delete "MI" and insert --MRI--.

Claims:

In claim 15, column 16, line 6, delete "parameters" and insert --parameters;--.

In claim 15, column 16, line 27, delete "excitation/ADG" and insert --excitation/ADC--.

In claim 15, column 16, line 27, delete "RE" and insert --RF--.

In claim 21, column 17, line 9, delete "RE" and insert --RF--.

In claim 21, column 17, line 10, delete "RE" and insert --RF--.

Signed and Sealed this

Sixteenth Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,643,864 B2
APPLICATION NO. : 11/050341
DATED : January 5, 2010
INVENTOR(S) : Elgort et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1239 days.

Signed and Sealed this

Sixteenth Day of November, 2010

David J. Kappos
*Director of the United States Patent and Trademark Office*